United States Patent
Tsai

(10) Patent No.: US 9,509,286 B2
(45) Date of Patent: Nov. 29, 2016

(54) DRIVING CIRCUIT, DRIVING APPARATUS, AND METHOD FOR ADJUSTING OUTPUT IMPEDANCE TO MATCH TRANSMISSION LINE IMPEDANCE BY USING CURRENT ADJUSTMENT

(71) Applicant: Shan-Ju Tsai, Hsin-Chu (TW)

(72) Inventor: Shan-Ju Tsai, Hsin-Chu (TW)

(73) Assignee: Faraday Technology Corp., Hsin-Chu (TW)

(*) Notice: Subject to any disclaimer, the term of this patent is extended or adjusted under 35 U.S.C. 154(b) by 0 days.

(21) Appl. No.: 14/667,710

(22) Filed: Mar. 25, 2015

(65) Prior Publication Data
US 2016/0204767 A1 Jul. 14, 2016

(30) Foreign Application Priority Data
Jan. 14, 2015 (TW) .............................. 104101234 A

(51) Int. Cl.
| | |
|---|---|
| H03K 5/12 | (2006.01) |
| H03K 3/012 | (2006.01) |
| H03H 11/28 | (2006.01) |
| H03F 3/45 | (2006.01) |

(52) U.S. Cl.
CPC .......... H03K 3/012 (2013.01); H03F 3/45076 (2013.01); H03H 11/28 (2013.01); *H03F 2200/255* (2013.01); *H03F 2203/45116* (2013.01); *H03F 2203/45151* (2013.01)

(58) Field of Classification Search
CPC combination set(s) only.
See application file for complete search history.

(56) References Cited

U.S. PATENT DOCUMENTS

| | | | |
|---|---|---|---|
| 6,028,479 A | 2/2000 | Babanezhad | |
| 6,275,078 B1 | 8/2001 | Zabroda | |
| 6,556,039 B2* | 4/2003 | Nagano | H04L 25/0278 |
| | | | 326/30 |
| 7,196,567 B2 | 3/2007 | Nguyen | |
| 7,212,044 B2 | 5/2007 | Huang | |
| 8,405,431 B2* | 3/2013 | Yi | H03K 19/01852 |
| | | | 327/108 |
| 8,610,458 B2* | 12/2013 | Lee | H03K 19/0005 |
| | | | 326/30 |
| 9,000,618 B2* | 4/2015 | Liao | H04L 25/0282 |
| | | | 307/108 |
| 2002/0109493 A1 | 8/2002 | Hall | |
| 2013/0294294 A1 | 11/2013 | Pan | |

FOREIGN PATENT DOCUMENTS

TW 201240367 A1 10/2012

* cited by examiner

*Primary Examiner* — An Luu
(74) *Attorney, Agent, or Firm* — Winston Hsu; Scott Margo

(57) ABSTRACT

A driving circuit used in a transmission line includes an operational amplifier and an output circuit. The operational amplifier is used for receiving a voltage signal to generate an output. The output circuit is coupled to the operational amplifier and used for receiving the output of the operational amplifier and determining current(s) passing through the output circuit to generate an output signal of the driving signal so as to adjust the output impedance of the driving circuit to match the transmission line; the output impedance of driving circuit is adjustable and determined by the current(s) passing through the output circuit.

8 Claims, 4 Drawing Sheets

DRIVING CIRCUIT, DRIVING APPARATUS, AND METHOD FOR ADJUSTING OUTPUT IMPEDANCE TO MATCH TRANSMISSION LINE IMPEDANCE BY USING CURRENT ADJUSTMENT

BACKGROUND OF THE INVENTION

1. Field of the Invention

The present invention relates to a scheme for adjusting output impedance, and more particularly to a driving apparatus, driving circuit, and corresponding methods for using current adjustment to adjust the output impedance so as to make the output impedance match with the impedance of a transmission line.

2. Description of the Prior Art

Generally speaking, the output impedance of a line driver connected to a transmission line is usually designed to be matched with the characteristic impedance of the transmission line, to minimize signal reflection and avoid attenuated efficiency of signal transmission. A conventional line driver used with a transmission line may adjust resistances of its multiple resistors to adjust the amplitude of its output signal and output impedance to try to make its output impedance be equal to the impedance value specified by the standard of the transmission line, so as to make its output impedance match with the characteristic impedance of the transmission line. The conventional line driver is configured to compare the actual amplitude of the output voltage with that of a reference voltage and to control the resistances of the above-mentioned resistors based on the voltage comparison result, for adjusting its output impedance. However, practically, since it is necessary for the conventional line driver to employ the multiple resistors to adjust its output impedance by using voltage adjustment, the circuit size of conventional line driver would inevitably become larger, and the circuit cost would be increased unfortunately. Thus, in order to decrease the circuit cost, it is important to develop another scheme for adjusting the output impedance.

SUMMARY OF THE INVENTION

Therefore one of the objectives of the present invention is to provide a driving circuit, driving apparatus, and corresponding methods for adjusting the output impedance by using current adjustment to make the output impedance match with the characteristic impedance of a transmission line, so as to solve the above-mentioned problems.

According to an embodiment of the present invention, a driving circuit used in a transmission line is disclosed. The driving circuit comprises an operational amplifier and an output circuit. The operational amplifier is configured for receiving a voltage signal to generate an output. The output circuit is coupled to the operational amplifier and configured for receiving the output of the operational amplifier and determining a current passing through the output circuit to generate an output signal of the driving circuit to thereby adjust an output impedance of the driving circuit. The output impedance of the driving circuit is adjustable and determined by the current passing through the output circuit.

According to an embodiment of the present invention, a driving apparatus used in a transmission line is disclosed. The driving apparatus comprises a digital-to-analog converter, an amplifier, and a driving circuit. The digital-to-analog converter is configured for receiving an input current signal to correspondingly generate an output voltage signal. The amplifier is coupled to the digital-to-analog converter and configured for amplifying the output voltage signal to generate an amplified output voltage signal. The driving circuit is coupled to amplifier and configured for determining a current passing through the driving circuit according to the amplified output voltage signal to generate an output signal of the driving circuit to thereby adjust an output impedance of the driving apparatus. The output impedance is adjustable and determined by the current passing through the driving circuit.

According to an embodiment of the present invention, a driving method used in a transmission line is disclosed. The driving method comprises: providing an operational amplifier to receive a voltage signal to generate an output; and receiving the output of the operational amplifier and determining a passing current to generate an output signal to thereby adjust an output impedance to match the transmission line; wherein the output impedance is determined by the passing current and is adjustable.

According to an embodiment of the present invention, a method for a driving apparatus used in a transmission line is disclosed. The method comprises: using a digital-to-analog converter for receiving an input current signal to correspondingly generate an output voltage signal; amplifying the output voltage signal to generate an amplified output voltage signal; and, generating an output signal of the driving apparatus according to the amplified output voltage signal. An output impedance of the driving apparatus is determined a current passing through the driving apparatus and is adjustable.

In embodiments of the present invention, the scheme used in the driving circuit/apparatus/method can be performed or operated to control/adjust the amount of current passing through corresponding transistors to decide or adjust the output impedance of the above-mentioned driving apparatus/circuit to make the output impedance match with the characteristic impedance of a transmission line before/after the circuit chip leaves the factory, each time when the circuit chip is booted up, or at any timings. This can effectively achieve minimizing signal reflection, avoiding attenuated efficiency for signal transmission, and avoiding impedance mismatch due to semiconductor/resistor process variations.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
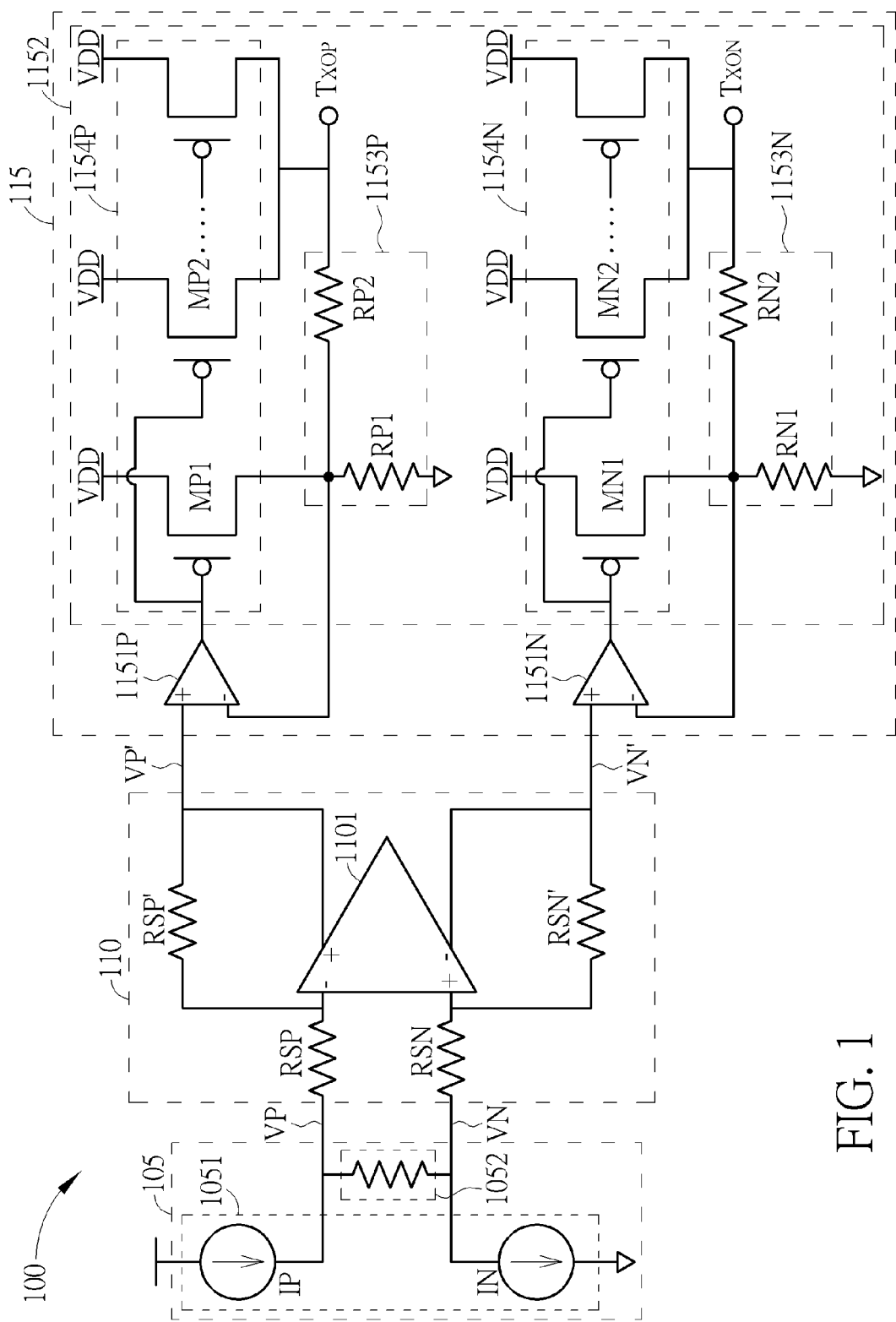
FIG. 1 is a circuit diagram of a driving apparatus according to a first embodiment of the present invention.

FIG. 1 is a circuit diagram of a driving apparatus 100 according to a first embodiment of the present invention. The driving apparatus 100 is connected to a transmission line such as an Ethernet transmission line. However, this is not meant to be a limitation of the present invention. The driving apparatus 100 is arranged for strengthening or boosting the signal amplitude for a signal inputted to the transmission line. For example, the driving apparatus 100 can strengthening or boosting the signal amplitude for an input signal when receiving the input signal, processing the input signal, and generating an output signal to the transmission line. In addition, in order to avoid or reduce the impedance mismatch caused by semiconductor process variation and/or resistor process variation, the driving apparatus 100 can determine or adjust its output impedance to make the output impedance match the characteristic resistance of the transmission line before/after the circuit chip leaves the factory, each time when the driving apparatus 100 is booted up, or at any timings.

In practice, the driving apparatus 100 comprises a digital-to-analog converter 105, an amplifying circuit 110, and a driving circuit 115. The digital-to-analog converter 105 comprises a current digital-to-analog converter 1051 and a resistor unit 1052. The current digital-to-analog converter 1051 is arranged to convert an input signal of driving apparatus 100 into a current signal. In this embodiment, the input signal is a differential signal. The current digital-to-analog converter 1051 comprises two current digital-to-analog converters that are respectively illustrated by IP and IN as shown in FIG. 1. The digital-to-analog converter 105 then employs the resistor unit 1052 to convert the output current signal of current digital-to-analog converter 1051 into a voltage signal. The voltage signal is composed by a set of differential signals that are respectively illustrated by VP and VN in FIG. 1. The amplifying circuit 110 is coupled to the digital-to-analog converter 105 and used for amplifying the output voltage signals VP and VN to generate amplified output voltage signals VP' and VN'. The amplifying circuit 110 comprises resistors RSP, RSP', RSN, RSN', and differential amplifier 1101. The resistor RSP' is designed as m times that the resistance of resistor RSP wherein m is a value greater than one. The resistor RSN' is also designed as m times the resistance of resistor RSN. The driving circuit 115 comprises operational amplifiers 1151P, 1151N, and output circuit 1152. The driving circuit 115 is coupled to the amplifying circuit 110 and is arranged for determining the amount of current passing through the driving circuit 115 to generate the output signal of the driving apparatus 100 according to the amplified output voltage signals VP' and VN' to thereby adjust the output impedance of the driving apparatus 100. The output impedance is adjustable and can be determined by the amount of current passing through the driving circuit 115. The operational amplifiers 1151P and 1151N are used for receiving the amplified output voltage signals VP', VN' of the amplifying circuit 110 to generate outputs respectively. The output circuit 1152 is coupled to the operational amplifiers 1151P, 1151N and used for receiving the outputs of operational amplifiers 1151P, 1151N to determining the amount of current passing through the output circuit 1152 to generate the output signals TXOP and TXON (i.e. the output signals of driving apparatus 100) of driving circuit 115 to thereby determine or adjust the output impedance of driving apparatus 100.

The output circuit 1152 comprises resistor networks 1153P, 1153N and current adjusting circuits 1154P, 1154N. The resistor network 1153P comprises resistors RP1 and RP2, and the resistor network 1153N comprises resistors RN1 and RN2. The resistance of resistor RP1 is designed as N×R, and the resistance of resistor RP2 is designed as (N+1)×R. The resistance of resistor RN1 is designed as N×R, and the resistance of resistor RN2 is designed as (N+1)×R. That is, the resistors RP1 and RN1 are designed as N times the value of unit resistance R, and the resistors RP2 and RN2 are designed as (N+1) times the value of unit resistance R. The current adjusting circuits 1154P and 1154N are respectively coupled to the resistor networks 1153P and 1153N and used for adjusting the amounts of currents passing through the current adjusting circuits 1154P and 1154N to generate the output differential signals TXOP and TXON for adjusting the output impedance of driving apparatus 100, so as to make the output impedance of driving apparatus 100 match with the output impedance of the transmission line. Specifically, the current adjusting circuit 1154P comprises a first transistor MP1 and a plurality of second transistors MP2. The first transistor MP1 has a first terminal coupled to a reference power source level VDD, a second terminal coupled to the resistor network 1153P, and a control terminal coupled to the operational amplifier 1151P. Each of the second transistors MP2 respectively has a first terminal coupled to the reference power source level VDD, a second terminal coupled to the resistor network 1153P, and a control terminal coupled to the output of operational amplifier 1151P. The current adjusting circuit 1154P is arranged for adjusting/controlling the number of conductive transistor(s) within the second transistors MP2 so as to determine the amount of current passing through the current adjusting circuit 1154P for adjusting the output impedance. The current adjusting circuit 1154N comprises a first transistor MN1 and a plurality of second transistors MN2. The first transistor MN1 has a first terminal coupled to the reference power source level VDD, a second terminal coupled to the resistor network 1153N, and a control terminal coupled to the output of operational amplifier 1151N. Each second transistor MN2 respectively has a first terminal coupled to the reference power source level VDD, a second terminal coupled to the resistor network 1153N, and a control terminal coupled to the output of operational amplifier 1151N. The current adjusting circuit 1154N is arranged for adjusting the number of conductive transistor(s) within the second transistors MN2 so as to determine the amount of current passing through the current adjusting circuit 1154N for adjusting the output impedance.

Specifically, in this embodiment, the output current of current digital-to-analog converter 1051 passes through the resistor unit 1052 and is converted into the set of output voltage signals VP and VN. By using the current digital-to-analog converter 1051, the voltage waveforms of output voltage signals VP and VN can be configured as 1/m times the amplitude of original output voltage signals. Correspondingly, the current amount of current digital-to-analog converter 1051 can be decreased to be 1/m times the variation of original current amount. In the following stage, since resistor RSP' in the amplifying circuit 110 is configured as m times the resistance of resistor RSP and the resistor RSN' in the amplifying circuit 110 is configured as m times the resistance of resistor RSN, the amplitudes of voltage waveforms of output voltage signals VP and VN are amplified by the amplifying circuit 110 with m times and equivalently can be recovered to be equal to the amplitude of waveform form of an original output voltage signal. Thus, the current amount of current digital-to-analog converter 1051 can be decreased to be 1/m times the variation of original current amount. This makes that the undesired influence due to transistor's channel length modulation can be alleviated and the linearity of the output signals can be improved. Also, the required circuit size and power consumption can be reduced significantly. In addition, using the above-mentioned digital-to-analog converter 105 with the amplifying circuit 110 is not meant to be a limitation of the present invention. In another embodiment, it may be not necessary for implementing the digital-to-analog converter 105 and amplifying circuit 110 within a driving apparatus if the influence caused by transistor's channel length modulation is not considered. That is, the digital-to-analog converter 105 and the amplifying circuit 110 are optional.

Figure 2:
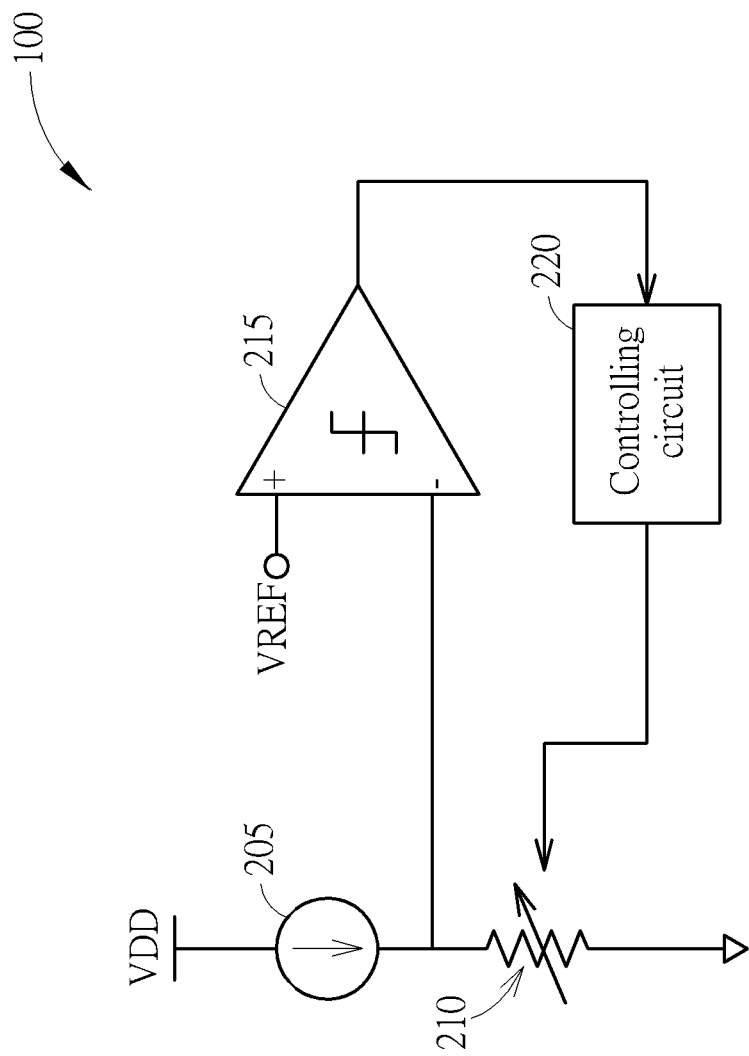
FIG. 2 is a circuit diagram illustrating an adjusting circuit included within the driving apparatus as shown in FIG. 1.

Additionally, the driving apparatus 100 further comprises an adjusting circuit 200 used for adjusting, controlling, or determining the numbers of conductive transistor(s) within the second transistors MP2 and MN2 to controlling the amount of passing currents. Please refer to FIG. 2, which is a circuit diagram illustrating the adjusting circuit 200 included within the driving apparatus 100 as shown in FIG. 1. As shown in FIG. 2, the adjusting circuit 200 comprises a reference current source 205, a reference voltage VREF, a variable resistor 210, an error amplifier 215, and a controlling circuit 220. The reference current source 205 is used for providing a reference current having constant current amount. The reference voltage VREF is configured as a constant voltage. The non-inverting input terminal of error amplifier 215 is coupled to the reference voltage VREF and its inverting terminal is coupled between the reference current source 205 and variable resistor 210 for receiving a voltage across two terminals of variable resistor 210. The controlling circuit 220 is coupled to the output terminal of error amplifier 215 and used for receiving the output of error amplifier 215 to determine/adjust the resistance of variable resistor 210. Then the controlling circuit 220 can adjust the output impedance of driving apparatus 100 by using the determined resistance of variable resistor 210. For example, if the characteristic impedance of transmission line is equal to 50Ω, the adjusting circuit 200 can use the controlling circuit 220 to determine/adjust the resistance of variable resistor 210 according to the output of error amplifier 215 before adjusting the output impedance of driving apparatus 100, so as to make the resistance of variable resistor 210 be equal to 50Ω finally when the level at the non-inverting input terminal of error amplifier 215 becomes almost equal to the level of reference voltage VREF. When the resistance of variable resistor 210 has been determined, the resistance (e.g. 50Ω) of variable resistor 210 can be employed for adjusting the output impedance of driving apparatus 100.

Figure 3:
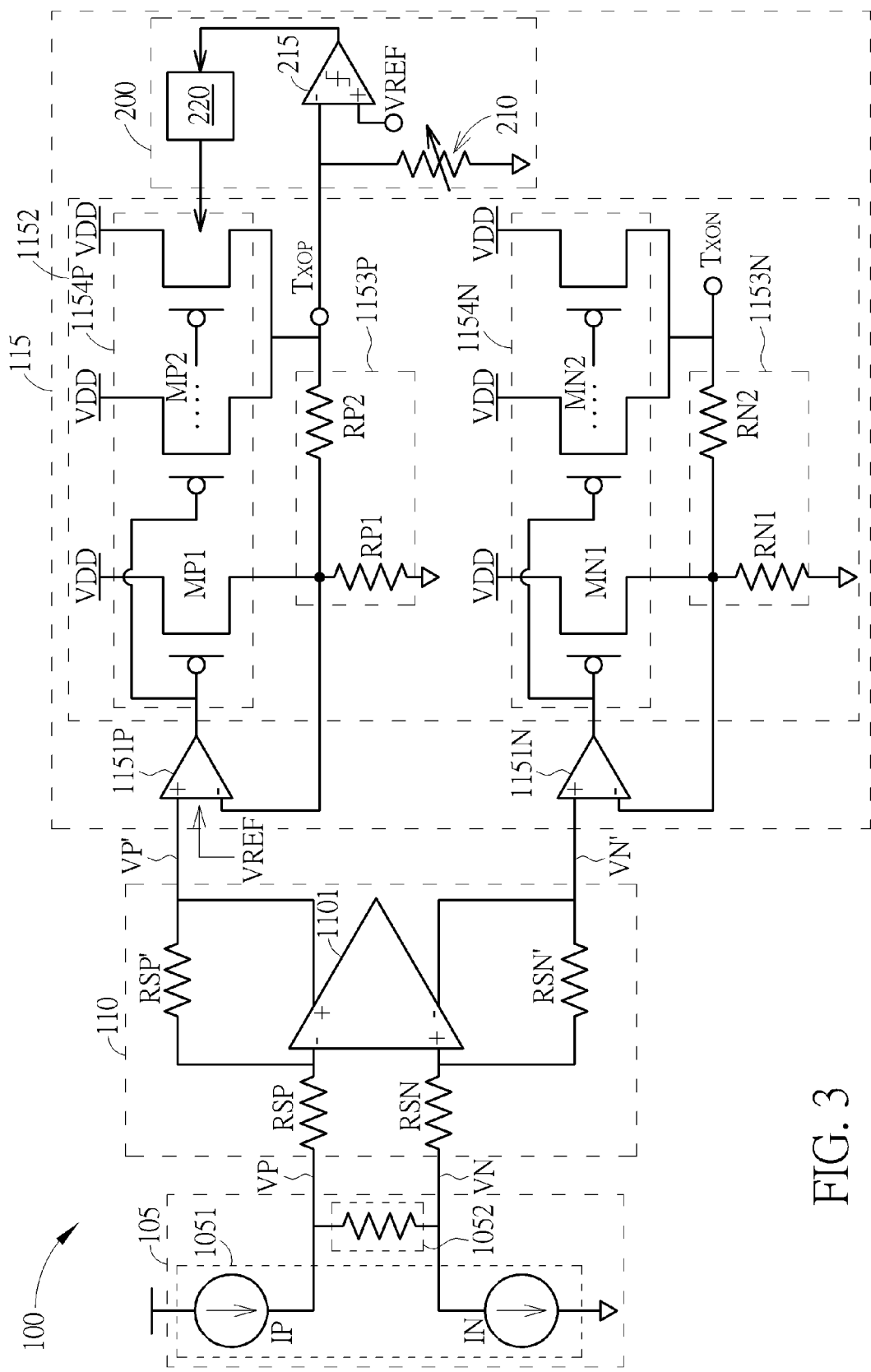
FIG. 3 is a diagram illustrating operations of using the adjusting circuit of FIG. 2 to adjust the output impedance of driving apparatus of FIG. 1.

Please refer to FIG. 3, which is a diagram illustrating operations of using the adjusting circuit 200 of FIG. 2 to adjust the output impedance of driving apparatus 100. Before starting to adjust or determine the output impedance of driving apparatus 100, as shown in FIG. 2, the adjusting circuit 200 is arranged for adjusting the resistance of variable resistor 210 according to the current of reference current source 205 to make the resistance of variable resistor 210 equal to a predetermined resistance such as 50Ω. After the resistance of variable resistor 210 has been determined or adjusted, the adjusting circuit 200 is arranged to use the variable resistor 210, error amplifier 215, and the controlling circuit 220 to adjust or determine the number of conductive transistor(s) within the second transistors MP2 to adjust the output impedance so as to make the output impedance be equal to the predetermined resistance (e.g. 50Ω) to match with the characteristic impedance of the transmission line. In this example, as shown in FIG. 3, the non-inverting input terminal of error amplifier 215 is coupled to the reference voltage VREF, and its non-inverting input terminal is coupled to the variable resistor 210 and the output port of differential signal TXOP of the output circuit 1152. The output terminal of error amplifier 215 is coupled to the controlling circuit 220. The controlling circuit 220 is arranged to control/adjust the number of conductive transistor(s) within the second transistors MP2 according to the output of error amplifier 215. In this example, initially the input signal of non-inverting input terminal of operational amplifier 1151P is changed to the reference voltage VREF, and the non-inverting input terminal is not arranged to receive the voltage signal VP' until the procedure for adjusting the output impedance has been completed. In other words, during the procedure for adjusting the output impedance, the input signal of one differential terminal of the driving circuit 115 is kept at the voltage level of reference voltage VREF. By using the error amplifier 215 and controlling circuit 220 to adjust the number of conductive transistor(s) within the second transistors MP2, this can adequately increase or decrease the amount of passing current to make the level of a corresponding output signal at one differential terminal of driving circuit 115 be substantially equal to the level of reference voltage VREF finally. In this condition, the output impedance of driving circuit 115 (seeing from the above-mentioned differential terminal) would match with the resistance of variable resistor 210, and accordingly the output impedance would also match with the characteristic impedance of the transmission line. After the procedure for adjusting the output impedance has been completed, as shown in FIG. 1, the operational amplifier 1151P is no longer arranged to receive the level of reference voltage VREF and instead is arranged to receive the amplified voltage signal VP' at one differential terminal of the amplifying circuit 110. The adjusting circuit 200 is not required in this situation, and the connection between the variable resistor 210 and one corresponding differential output terminal of driving circuit 115 would become disconnected. The adjusting circuit 200 is not used for adjusting the number of conductive transistor(s) within the second transistors MP2 in this situation.

Further, for adjusting the output impedance of the other output terminal (corresponding to the differential signal TXON) of the driving circuit 115, in an embodiment, adjusting circuit 200 can be used for adjusting the number of conductive transistor(s) within the second transistors MN2 to adjust the output impedance of the other output terminal corresponding to the differential signal TXON, so as to make the output impedance match with the characteristic impedance of the transmission line; the steps of an procedure for adjusting the output impedance in this example are similar to that mentioned in the example for adjusting the output impedance of the output terminal corresponding to the differential signal TXOP. It should be noted that the number of conductive transistor(s) within the second transistors MN2 may be different from that within the second transistors MP2 since different and distinct resistors may have different process variations. Additionally, in order to save more time when adjusting the output impedance, the adjusting circuit 200 may adjust/determine the number of conductive transistor(s) within the second transistors MP2 to adjust/determine the output impedance at the output terminal corresponding to the differential signal TXOP according to the determined number of conductive transistor(s) within the second transistors MN2 after finishing or completing the procedure of adjusting the output impedance at the output terminal corresponding to the differential signal TXON. This may also make the output impedance at the other output terminal match with the characteristic impedance of the transmission line.

Figure 4:
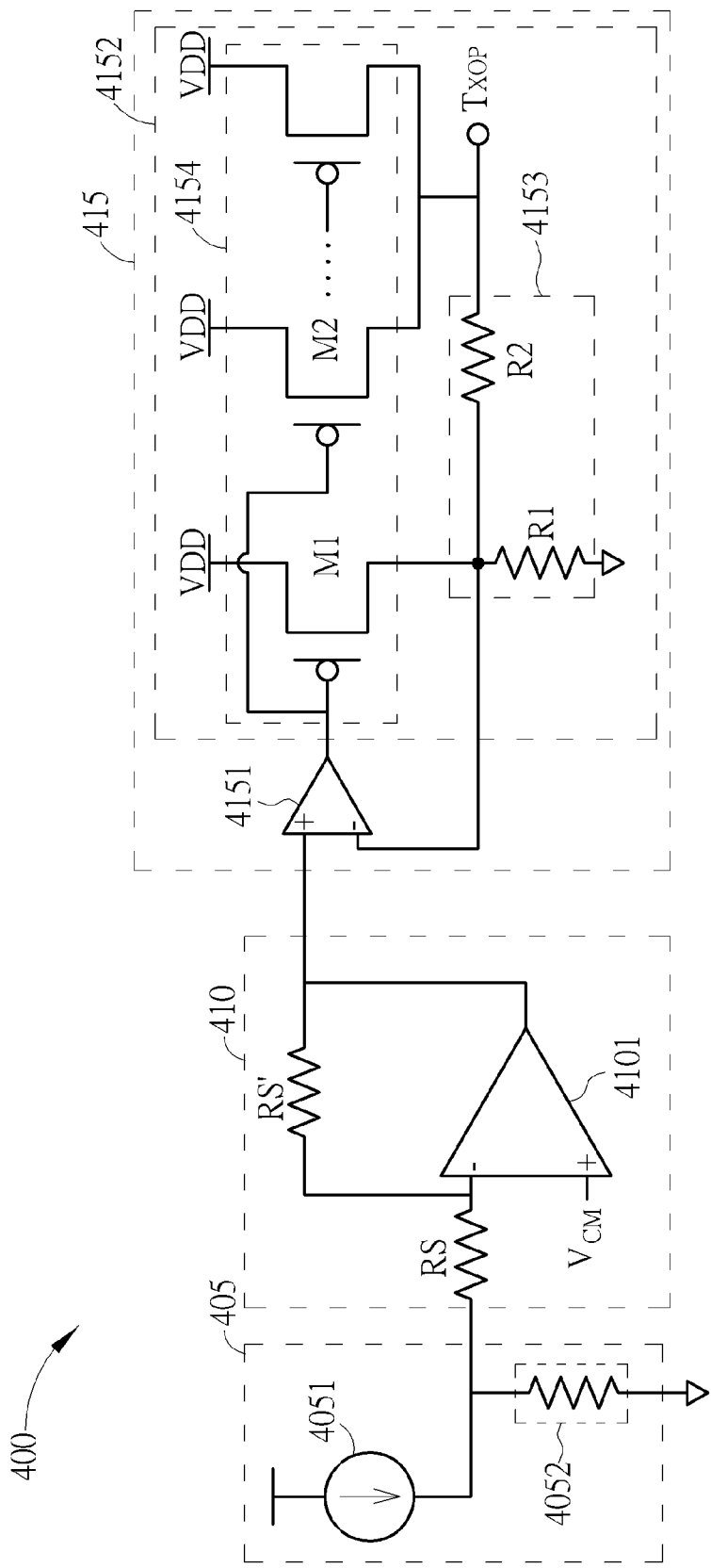
FIG. 4 is a circuit diagram of a driving apparatus according to a second embodiment of the present invention.

Further, the scheme of driving apparatus in the embodiments can be also applied for the transmission line having one single-end output port. Please refer to FIG. 4, which is a circuit diagram of the driving apparatus 400 according to a second embodiment of the present invention. The driving apparatus 400 comprises a digital-to-analog converter 405, an amplifying circuit 410, and a driving circuit 415. The digital-to-analog converter 405 comprises a current digital-to-analog converter 4051 and a resistor unit 4052. The current digital-to-analog converter 4051 is used for converting an input signal inputted to the driving apparatus 400 into a current signal. The resistor unit 4052 is used for converting the current signal outputted by the current digital-to-analog converter 4051 into an output voltage signal. The amplifying circuit 410 is coupled to the digital-to-analog converter 405 and utilized for amplifying the output voltage signal to generate an amplified output voltage signal. The amplifying circuit 410 comprises resistors RS, RS', and the amplifier 4101. The resistor RS' is configured as m times the resistance of resistor RS wherein the value m is greater than one. The driving circuit 415 comprises an operational amplifier 4151 and an output circuit 4152. The driving circuit 415 is coupled to the amplifying circuit 410 and used for determining the amount of current passing through the driving circuit 415 itself to generate the output signal of driving apparatus 400 according to the amplified output voltage signal to thereby adjust the output impedance of driving apparatus 400. The output impedance is adjustable and is determined by the amount of current passing through the driving circuit 415. The operational amplifier 4151 is used for receiving the amplified output voltage signal from the amplifying circuit 410 to generate an output. The output circuit 4152 is coupled to the operational amplifier 4151 and is used for receiving the output of the operational amplifier 4151 and determining the amount of current passing through the output circuit 4152 to generate the output signal of driving circuit 415 to thereby decide or adjust the output impedance of apparatus 400. The output circuit 4152 comprises a resistor network 4153 and a current adjusting circuit 4154. The resistor network 4153 comprises resistors R1 and R2. The resistance of resistor R1 is designed as N×R, and the resistance of resistor R2 is designed as (N+1)×R. That is, the resistor R1 is designed as N times the value of unit resistance R, and the resistor R2 is designed as (N+1) times the value of unit resistance R. The current adjusting circuit 4154 is coupled to the resistor network 4153 and used for adjusting the amount of current passing through the current adjusting circuit 4154 itself to generate an output signal to thereby adjust the output impedance of apparatus 400, so as to make the output impedance match with the characteristic impedance of the transmission line. Specifically, the current adjusting circuit 4154 comprises a first transistor M1 and a plurality of second transistors M2. The first transistor M1 has a first terminal coupled to a reference power source level VDD, a second terminal coupled to the resistor network 4153, and a control terminal coupled to the output of operational amplifier 4151. Each second transistor M2 respectively has a first terminal coupled to the reference power source level VDD, a second terminal coupled to the resistor network 4153, and a control terminal coupled to the output of operational amplifier 4151. The current adjusting circuit 4154 is arranged to adjust the number of conductive transistor(s) with the second transistors M2 to decide the amount of current passing through the current adjusting circuit 4154 to adjust the output impedance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving circuit used in a transmission line, comprising:
    an operational amplifier, configured for receiving a voltage signal to generate an output;
    an output circuit, coupled to the operational amplifier, configured for receiving the output of the operational amplifier and determining a current passing through the output circuit to generate an output signal of the driving circuit to thereby adjust an output impedance of the driving circuit;
    an error amplifier, having a first input terminal of the output circuit, a second input terminal coupled to a reference voltage, and an output terminal; and
    a controlling circuit, coupled to the output terminal of the error amplifier, configured for receiving an output of the error amplifier to adjust the current passing through the output circuit to thereby adjust the output impedance of the driving circuit;
    wherein the output impedance of the driving circuit is adjustable and determined by the current passing through the output circuit; the reference voltage is inputted to the operational amplifier to be used as an input signal of the operational amplifier when the controlling circuit adjusts the current passing through the output circuit.

2. The driving circuit of claim 1, wherein the output circuit comprises:
    a resistor network; and
    a current adjusting circuit, coupled to the resistor network, configured for adjusting a current passing through the current adjusting circuit, to generate the output signal of the driving circuit to thereby adjust the output impedance of the driving circuit.

3. The driving circuit of claim 2, wherein the current adjusting circuit comprises:
    a first transistor, having a first terminal coupled to a reference level, a second terminal coupled to the resistor network, and a control terminal coupled to the output of the operational amplifier; and
    a plurality of second transistors, respectively having a first terminal coupled to the reference level, a second terminal coupled to the resistor network, and a control terminal coupled to the output of the operational amplifier;
    wherein the current adjusting circuit is arranged to adjust a number of conductive transistor(s) within the plurality of second transistors, to determine the current passing through the current adjusting circuit.

4. A driving apparatus used in a transmission line, comprising:
    a digital-to-analog converter, configured for receiving an input current signal to correspondingly generate an output voltage signal;
    an amplifier, coupled to the digital-to-analog converter, configured for amplifying the output voltage signal to generate an amplified output voltage signal; and
    a driving circuit, coupled to amplifier, configured for determining a current passing through the driving circuit according to the amplified output voltage signal to generate an output signal of the driving circuit to thereby adjust an output impedance of the driving apparatus, wherein the output impedance is adjustable and determined by the current passing through the driving circuit;

the driving circuit comprises:
   an operational amplifier, configured for receiving the amplified output voltage signal to generate an output;
   a resistor network;
   a first transistor, having a first terminal coupled to a reference level, a second terminal coupled to the resistor network, and a control terminal coupled to the output of the operational amplifier;
   a plurality of second transistors, respectively having a first terminal coupled to the reference level, a second terminal coupled to the resistor network, and a control terminal coupled to the output of the operational amplifier;
   an error amplifier, having a first input terminal coupled to the resistor network, a second input terminal coupled to a reference voltage, and an output terminal; and
   a controlling circuit, coupled to the output terminal of the error amplifier, configured for receiving an output of the error amplifier to adjust current passing through the plurality of second transistors to thereby adjust the output impedance of the driving circuit;
   wherein the driving circuit is arranged to adjust a number of conductive transistor(s) within the plurality of second transistors to determine the current passing through the driving circuit to thereby adjust the output impedance; the reference voltage is inputted to the operational amplifier to be used as an input signal of the operational amplifier when the controlling circuit is arranged to adjust the current passing through the second transistors.

5. A driving method used in a transmission line, comprising:
   providing an operational amplifier to receive a voltage signal to generate an output;
   receiving the output of the operational amplifier and determining a passing current to generate an output signal to thereby adjust an output impedance to match the transmission line;
   providing an error amplifier having a first input terminal coupled to the output circuit, a second input terminal coupled to a reference voltage, and an output terminal; and
   receiving an output of the error amplifier to adjust the passing current to thereby adjust the output impedance to match the transmission line;
   wherein the output impedance is determined by the passing current and is adjustable; the reference voltage is inputted to the operational amplifier to be used as an input signal of the operational amplifier when the passing current passing through the output circuit is adjusted.

6. The driving method of claim 5, wherein the step of determining the passing current comprises:
   providing a resistor network; and
   providing a current adjusting circuit to adjust the current passing through the current adjusting circuit to generate the output signal to thereby adjust the output impedance.

7. The driving method of claim 6, wherein the step of adjusting the current passing through the current adjusting circuit comprises:
   providing a first transistor having a first terminal coupled to a reference level, a second terminal coupled to the resistor network, and a control terminal coupled to the output of the operational amplifier;
   providing a plurality of second transistors each respectively has a first terminal coupled to the reference level, a second terminal coupled to the resistor network, and a control terminal coupled to the output of the operational amplifier; and
   adjusting a number of conductive transistor(s) within the plurality of second transistors to determine the current passing through the current adjusting circuit.

8. A method for a driving apparatus used in a transmission line, comprising:
   using a digital-to-analog converter for receiving an input current signal to correspondingly generate an output voltage signal;
   amplifying the output voltage signal to generate an amplified output voltage signal, the step of generating the output signal of the driving apparatus according to the amplified output voltage signal comprises:
      using an operational amplifier for receiving the amplified output voltage signal to generate an output;
      providing a resistor network;
      providing a first transistor having a first terminal coupled to a reference level, a second terminal coupled to the resistor network, and a control terminal coupled to the output of the operational amplifier;
      providing a plurality of second transistors each respectively having a first terminal coupled to the reference level, a second terminal coupled to the resistor network, and a control terminal coupled to the output of the operational amplifier; and
      adjusting a number of conductive transistor(s) within the plurality of second transistors, to determine a current passing through the plurality of second transistors to thereby adjust the output impedance of the driving apparatus; and
   generating an output signal of the driving apparatus according to the amplified output voltage signal, wherein an output impedance of the driving apparatus is determined a current passing through the driving apparatus and is adjustable;
   providing an error amplifier having a first input terminal coupled to the resistor network, a second input terminal coupled to a reference voltage, and an output terminal; and
   receiving an output of the error amplifier to adjust the current passing through the plurality of second transistors to thereby adjust the output impedance of the driving apparatus;
   wherein the reference voltage is inputted to the operational amplifier to be used as an input signal of the operational amplifier when the current passing through the plurality of second transistors is adjusted.

* * * * *